United States Patent
Thompson et al.

(10) Patent No.: US 7,265,055 B2
(45) Date of Patent: Sep. 4, 2007

(54) CMP OF COPPER/RUTHENIUM SUBSTRATES

(75) Inventors: Christopher C. Thompson, Earlville, IL (US); Vlasta Brusic, Geneva, IL (US); Renjie Zhou, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 29 days.

(21) Appl. No.: 11/259,645

(22) Filed: Oct. 26, 2005

(65) Prior Publication Data

US 2007/0090094 A1    Apr. 26, 2007

(51) Int. Cl.
*H01L 21/302* (2006.01)

(52) U.S. Cl. .................. 438/692; 438/693; 252/79.1

(58) Field of Classification Search ............. 438/690, 438/691, 692, 693; 252/79.1, 79.5
See application file for complete search history.

(56) References Cited

U.S. PATENT DOCUMENTS

| | | | |
|---|---|---|---|
| 5,691,219 A | | 11/1997 | Kawakubo et al. |
| 6,441,492 B1 * | | 8/2002 | Cunningham ............... 257/762 |
| 6,812,143 B2 | | 11/2004 | Lane et al. |
| 6,821,897 B2 | | 11/2004 | Schroeder et al. |
| 6,852,632 B2 | | 2/2005 | Wang et al. |
| 6,869,336 B1 | | 3/2005 | Hardikar |
| 2003/0166337 A1 * | | 9/2003 | Wang et al. ................. 438/689 |
| 2003/0228762 A1 * | | 12/2003 | Moeggenborg et al. ...... 438/691 |
| 2003/0228763 A1 * | | 12/2003 | Schroeder et al. ........... 438/691 |
| 2004/0077295 A1 * | | 4/2004 | Hellring et al. ................ 451/41 |
| 2004/0077296 A1 * | | 4/2004 | Hellring et al. ................ 451/41 |
| 2004/0209555 A1 | | 10/2004 | Sun et al. |
| 2004/0266196 A1 * | | 12/2004 | De Rege Thesauro et al. ............................ 438/698 |
| 2005/0064798 A1 * | | 3/2005 | Hardikar ....................... 451/41 |
| 2005/0148187 A1 * | | 7/2005 | Wang et al. ................. 438/693 |
| 2005/0233578 A1 * | | 10/2005 | Jia et al. ...................... 438/633 |

FOREIGN PATENT DOCUMENTS

WO    WO 2005/033234 A2    4/2005

* cited by examiner

*Primary Examiner*—Kin-Chan Chen
(74) *Attorney, Agent, or Firm*—Thomas Omholt; Francis J. Koszyk

(57) ABSTRACT

The invention provides a method of chemically-mechanically polishing a substrate. A substrate comprising ruthenium and copper is contacted with a chemical-mechanical polishing system comprising a polishing component, hydrogen peroxide, an organic acid, at least one heterocyclic compound comprising at least one nitrogen atom, and water. The polishing component is moved relative to the substrate, and at least a portion of the substrate is abraded to polish the substrate. The pH of the polishing system is about 6 to about 12, the ruthenium and copper are in electrical contact, and the difference between the open circuit potential of copper and the open circuit potential of ruthenium in the polishing system is about 50 mV or less.

19 Claims, No Drawings

CMP OF COPPER/RUTHENIUM SUBSTRATES

FIELD OF THE INVENTION

The invention pertains to chemical-mechanical polishing compositions and methods.

BACKGROUND OF THE INVENTION

Compositions and methods for planarizing or polishing the surface of a substrate, especially for chemical-mechanical polishing (CMP), are well known in the art. Polishing compositions (also known as polishing slurries) used in CMP processes typically contain an abrasive material in an aqueous solution, and are applied to a surface by contacting the surface with a polishing pad saturated with the polishing composition. Typical abrasive materials include aluminum oxide, cerium oxide, silicon dioxide, and zirconium oxide. The polishing composition is generally used in conjunction with a polishing pad (e.g., polishing cloth or disk). The polishing pad may contain abrasive material in addition to, or instead of, the abrasive material in the polishing composition.

Polishing compositions for silicon dioxide based intermetal dielectric layers have been particularly well developed in the semiconductor industry, and the chemical and mechanical nature of polishing and wear of the silicon dioxide based dielectrics is reasonably well understood. One problem with the silicon dioxide-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which a circuit can operate. Strategies being developed to increase the frequency at which the circuit can operate include (1) incorporating metals with lower resistivity values (e.g., copper), and (2) providing electrical isolation with insulating materials having lower dielectric constants relative to silicon dioxide.

One way to fabricate planar copper circuit traces on a dielectric substrate is referred to as the damascene process. In accordance with this process, the silicon dioxide dielectric surface is patterned by a conventional dry etch process to form holes (i.e., vias) and trenches for vertical and horizontal interconnects prior to deposition of copper onto the surface. Copper has the property of being a fast diffuser and can move quickly through the underlying dielectric layer to "poison" the device. Thus, a diffusion barrier layer is typically applied to the substrate before deposition of copper. The diffusion barrier layer is provided with a copper seed layer and then over-coated with a copper layer from a copper plating bath. Chemical-mechanical polishing is employed to reduce the thickness of the copper over-layer, as well as the thickness of the diffusion barrier layer, until a planar surface that exposes elevated portions of the dielectric surface is obtained. The vias and trenches remain filled with electrically conductive copper forming the circuit interconnects.

Tantalum and tantalum nitride have found wide acceptance in the industry as barrier layer materials and are typically applied to a substrate by physical vapor deposition (PVD). However, as the lines defining circuits are being reduced in size to the 65 nm and 45 nm scale, one concern is to avoid degrading the current carrying capacity of the copper lines. As the dimensions of copper lines are reduced, electron scattering from the lines becomes significant and causes an increase in resistivity. One solution is to reduce the thickness of the barrier layer and thereby allow for a proportionately thicker copper line within a given trench by using an atomic layer deposited (ALD) barrier layer. A copper seed layer is then applied by a conventional PVD process. However, formation of the copper seed layer is complicated by the need to provide a precise thickness of the layer to avoid overhang at the top of trenches with overly thick layers and to avoid copper oxidation by atmospheric oxygen occurring with overly thin layers.

One proposed solution is to plate copper directly onto a diffusion barrier. Ruthenium, in particular, has shown promise in this application. The insolubility of copper in ruthenium makes ruthenium suitable for use as a diffusion barrier, and the electrical conductivity of ruthenium allows for direct plating of copper onto the ruthenium, which obviates the need for a copper seed layer. Although the possibility of replacing tantalum/tantalum nitride barriers layers with ruthenium remains an attractive possibility, the likely course of development appears to lie with a copper-ruthenium-tantalum/tantalum nitride system.

Polishing compositions that have been developed for ruthenium and other noble metals typically contain strong oxidizing agents, have a low pH, or both. Copper tends to oxidize very rapidly in these polishing compositions. Additionally, because of the difference in standard reduction potentials of ruthenium and copper, copper suffers from galvanic attack by ruthenium in the presence of conventional ruthenium polishing compositions. The galvanic attack leads to etching of copper lines and a resulting degradation of circuit performance. Further, the wide difference in chemical reactivity of copper and ruthenium in conventional polishing compositions results in widely differing rates of removal in chemical-mechanical polishing of substrates containing both metals, which can result in overpolishing of copper.

Finally, substrates comprising tantalum or tantalum nitride in addition to ruthenium and copper pose additional challenges in that polishing compositions suitable for ruthenium or copper, themselves highly dissimilar materials, are typically unsuitable for the polishing of tantalum or tantalum nitride layers. Successful implementation of ruthenium-copper-tantalum microelectronic technology would require new polishing methods suitable for polishing of all three materials.

Thus, there remains a need in the art for improved polishing compositions and methods for chemical-mechanical polishing of substrates comprising ruthenium and copper and optionally tantalum or tantalum nitride.

BRIEF SUMMARY OF THE INVENTION

The invention provides a method of chemically-mechanically polishing a substrate, which method comprises (i) contacting a substrate comprising at least one layer of ruthenium and at least one layer of copper with a chemical-mechanical polishing system comprising (a) a polishing component selected from the group consisting of a polishing pad, an abrasive, and a combination thereof, (b) hydrogen peroxide, (c) an organic acid, (d) at least one heterocyclic compound, wherein the at least one heterocyclic compound comprises at least one nitrogen atom, and (e) water, (ii) moving the polishing component relative to the substrate, and (iii) abrading at least a portion of the substrate to polish the substrate. The pH of the water and any components dissolved or suspended therein is about 6 to about 12. The at least one layer of ruthenium and at least one layer of copper are in electrical contact, and the difference between the open circuit potential of copper and the open circuit potential of ruthenium in the water and any components dissolved or suspended therein is about 50 mV or less.

DETAILED DESCRIPTION OF THE INVENTION

The invention provides a method of chemically-mechanically polishing a substrate. The method of polishing involves contacting a substrate comprising at least one layer of ruthenium and at least one layer of copper with a polishing system. The polishing system comprises (a) a polishing component selected from the group consisting of a polishing pad, an abrasive, and a combination thereof, (b) hydrogen peroxide, (c) an organic acid, (d) at least one heterocyclic compound, wherein the at least one heterocyclic compound comprises at least one nitrogen atom, and (e) water. The polishing component is moved relative to the substrate, and at least a portion of the substrate is abraded to polish the substrate. The water and any components dissolved or suspended therein form the polishing composition of the polishing system. The pH of the polishing composition is about 6 to about 12. The at least one layer of ruthenium and at least one layer of copper are in electrical contact, and the difference between the open circuit potential of copper and the open circuit potential of ruthenium in the polishing composition is about 50 mV or less. The amounts of the components recited herein are based on the total weight of the polishing composition unless otherwise noted (i.e., the weight of the water and any components dissolved or suspended therein).

The substrate comprises at least one layer of ruthenium and at least one layer of copper, wherein the ruthenium and copper are in electrical contact. The substrate also can optionally further comprise at least one layer of tantalum. When present, the optional at least one tantalum layer can be disposed anywhere on the substrate, but preferably the at least one ruthenium layer is disposed between the at least one tantalum layer and the at least one copper layer. The tantalum layer can comprise tantalum metal or can comprise a suitable tantalum-containing compound, such as tantalum nitride, or a mixture of tantalum metal and a tantalum-containing compound. When the tantalum layer comprises tantalum nitride, the tantalum nitride can comprise a stochiometric tantalum nitride (i.e., TaN) or a nonstochiometric tantalum nitride, for example, $TaN_{0.5}$. The tantalum layer also can comprise a tantalum-containing compound of tantalum with nitrogen and carbon represented by the formula $TaN_xC_y$, wherein $x+y \leq 1$.

Typically, the substrate further comprises an insulating layer. Preferably, the at least one ruthenium layer is disposed between the at least one copper layer and the insulating layer. When present, the at least one tantalum layer is disposed between the at least one ruthenium layer and the insulating layer. The insulating layer can comprise any suitable dielectric material. The insulating layer can be a metal oxide (e.g., silicon oxide), porous metal oxide, glass, organic polymer, fluorinated organic polymer, or any other suitable insulating layer having a high or low dielectric constant. When the insulating layer comprises a silicon oxide, the silicon oxide can be derived from any suitable precursor. Preferably, the silicon oxide is derived from silane precursors, more preferably from oxidized silane precursors such as tetraethylorthosilicate (TEOS).

The polishing component is selected from the group consisting of a polishing pad, an abrasive, and the combination of a polishing pad and an abrasive. If an abrasive is present, the abrasive can be in any suitable form (e.g., abrasive particles). The abrasive can be fixed on the polishing pad and/or can be in particulate form and suspended in the water. The polishing pad can be any suitable polishing pad, many of which are known in the art.

The abrasive can be any suitable abrasive, for example, the abrasive can be natural or synthetic, and can comprise metal oxide, carbide, nitride, carborundum, and the like. The abrasive also can be a polymer particle or a coated particle. The abrasive desirably comprises a metal oxide. Preferably, the metal oxide is selected from the group consisting of alumina, ceria, silica, zirconia, co-formed products thereof, and combinations thereof. More preferably, the abrasive is alumina or silica. Most preferably, the metal oxide comprises α-alumina. When the abrasive comprises α-alumina, the abrasive also can comprise other forms of alumina, such as fumed alumina. The abrasive particles typically have an average particle size (e.g., average particle diameter) of about 20 nm to about 500 nm. Preferably, the abrasive particles have an average particle size of about 30 nm to about 400 nm (e.g., about 40 nm to about 300 nm, or about 50 nm to about 250 nm, or about 75 nm to about 200 nm).

When the abrasive comprises α-alumina, at least a portion of the α-alumina can be treated with a negatively-charged polymer or copolymer. For example, about 5 wt. % or more (e.g., about 10 wt. % or more, or about 50 wt. % or more, or substantially all, or all) of the α-alumina can be treated with a negatively-charged polymer or copolymer. The negatively-charged polymer or copolymer can be any suitable polymer or copolymer. Preferably, the negatively-charged polymer or copolymer comprises repeating units selected from the group consisting of carboxylic acid, sulfonic acid, and phosphonic acid functional groups. More preferably, the anionic polymer comprises repeating units selected from the group consisting of acrylic acid, methacrylic acid, itaconic acid, maleic acid, maleic anhydride, vinyl sulfonic acid, 2-(methacryloyloxy)ethanesulfonic acid, styrene sulfonic acid, 2-acrylamido-2-methylpropane sulfonic acid, vinylphosphonic acid, 2-(methacroyloxy)ethylphosphate, and combinations thereof. Most preferably, the negatively-charged polymer or copolymer is selected from the group consisting of poly(2-acrylamido-2-methylpropane sulfonic acid) and polystyrenesulfonic acid.

The α-alumina can be treated with a negatively-charged polymer or copolymer at any suitable time. For example, the α-alumina can be treated with a negatively-charged polymer or copolymer in a separate step to prepare pretreated α-alumina prior to addition of the pretreated α-alumina to the polishing system. In another embodiment, the negatively-charged polymer or copolymer can be separately added to the polishing system before, during, or after addition of the α-alumina to the polishing system.

When the abrasive is suspended in the water (i.e., when the abrasive is a component of the polishing system), any suitable amount of abrasive can be present in the polishing system. Typically, about 0.001 wt. % or more (e.g., about 0.01 wt. % or more) abrasive will be present in the polishing composition of the polishing system. More typically, about 0.1 wt. % or more abrasive will be present in the polishing composition. The amount of abrasive in the polishing composition typically will not exceed about 20 wt. %, more typically will not exceed about 10 wt. % (e.g., will not exceed about 5 wt. %). Preferably, the amount of abrasive in the polishing composition is about 0.05 wt. % to about 5 wt. %, and more preferably about 0.1 wt. % to about 2 wt. %.

The polishing system can comprise any suitable polishing pad (e.g., polishing surface). Moreover, suitable polishing pads can comprise any suitable polymer. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, elastomers, polyurethanes, polyolefins, polycarbonates, polyvinylalcohols, nylons, natural and synthetic rubbers, styrenic polymers, polyaromatics, fluoropolymers, polyimides, cross-linked polyurethanes, thermoset polyurethanes, cross-linked polyolefins, polyethers, polyesters, polyacrylates, elastomeric polyethylenes, copolymers and block copolymers thereof, and mixtures and blends thereof, coformed products thereof, and mixtures thereof.

The polishing pad can have any suitable density, hardness, thickness, compressibility, ability to rebound upon compression, and compression modulus. The polishing pad can further be produced by any suitable method. Suitable methods include casting, cutting, reaction injection molding, injection blow molding, compression molding, sintering, thermoforming, or pressing the chosen material into a desired shape. The polishing pad can comprise a solid monolith or can comprise pores. The pores can be open-celled, closed-celled, or a mixture of open and closed cells.

The polishing composition comprises hydrogen peroxide. The function of the hydrogen peroxide is to oxidize at least a part of the substrate. The hydrogen peroxide can be supplied from any suitable source. Hydrogen peroxide is commercially available as an aqueous solution in water at various concentrations, including 35% (w/w), 50% (w/w), and 70% (w/w). Solid forms of hydrogen peroxide include sodium percarbonate, calcium peroxide, and magnesium peroxide, which liberate free hydrogen peroxide when dissolved in water. Preferably, the hydrogen peroxide is provided as an aqueous solution.

The polishing composition can comprise any suitable amount of hydrogen peroxide. Typically, the polishing composition comprises about 0.01 wt. % or more (e.g., about 0.1 wt. % or more, or about 1 wt. % or more) of hydrogen peroxide. Preferably, the polishing composition comprises about 20 wt. % or less (e.g., about 10 wt. % or less, or about 5 wt. % or less) of hydrogen peroxide. More preferably, the polishing composition comprises about 0.5 wt. % to about 5 wt. % (e.g., about 1 wt. % to about 5 wt. %) of hydrogen peroxide.

The polishing composition comprises an organic acid. Organic acids useful in the polishing composition include carboxylic acids and sulfonic acids. Preferably, the polishing composition comprises a carboxylic acid. Non-limiting examples of suitable carboxylic acids include malonic acid, succinic acid, adipic acid, lactic acid, maleic acid, malic acid, citric acid, glycine, aspartic acid, tartaric acid, gluconic acid, iminodiacetic acid, and fumaric acid, or any carboxylic or amino carboxylic acid. Preferably, the organic acid is tartaric acid.

It will be appreciated that the aforementioned carboxylic acids can exist in the form of a salt (e.g., a metal salt, an ammonium salt, or the like), an acid, or as a partial salt thereof. For example, tartrates include tartaric acid, as well as mono- and di-salts thereof. Furthermore, carboxylic acids including basic functional groups can exist in the form of an acid salt of the basic functional group. For example, glycines include glycine, as well as acid salts thereof. Furthermore, some compounds can function both as an acid and as a chelating agent (e.g., certain amino acids and the like).

The polishing composition can comprise any suitable amount of the organic acid. Typically, the polishing composition comprises about 0.001 wt. % or more (e.g., about 0.01 wt. % or more, or about 0.05 wt. % or more, or about 0.1 wt. %) organic acid. Preferably, the polishing composition comprises about 5 wt. % or less (e.g., about 4 wt. % or less, or about 3 wt. % or less, or even about 2 wt. % or less) organic acid.

The polishing composition comprises at least one heterocyclic compound, wherein the at least one heterocyclic compound comprises at least one nitrogen atom. The at least one heterocyclic compound acts as a corrosion inhibitor, preferably a copper-corrosion inhibitor. For the purposes of this invention, a corrosion inhibitor is any compound, or mixture of compounds, that facilitates the formation of a passivation layer (i.e., a dissolution-inhibiting layer) on at least a portion of the surface of the substrate being polished. A copper-corrosion inhibitor is any compound that facilitates the formation of a passivation layer on copper. The heterocyclic compound comprising at least one nitrogen atom desirably comprises one or more 5- or 6-membered, heterocyclic, nitrogen-containing rings. Preferred corrosion inhibitors include but are not limited to 1,2,3-triazole, 1,2,4-triazole, benzotriazole, benzimidazole, benzothiazole, and derivatives thereof, such as, for example, hydroxy-, amino-, imino-, carboxy-, mercapto-, nitro-, urea-, thiourea-, or alkyl-substituted derivatives thereof. Most preferably, the at least one heterocyclic compound is selected from the group consisting of benzotriazole, 1,2,3-triazole, 1,2,4-triazole, and mixtures thereof. The polishing composition of the invention can comprise any suitable amount of the at least one heterocyclic compound. Typically, the polishing composition comprises about 0.005 wt. % or more (e.g., about 0.01 wt. % or more, or about 0.025 wt. % or more, or about 0.05 wt. % or more) of the at least one heterocyclic compound. Preferably, the polishing composition comprises about 1 wt. % or less (e.g., about 0.5 wt. % or less, or about 0.25 wt. % or less, or even about 0.1 wt. % or less) of the at least one heterocyclic compound.

In a first embodiment, the polishing system comprises benzotriazole or a derivative thereof as the sole heterocyclic compound. Preferably, the polishing system comprises benzotriazole as the sole heterocyclic compound. In this first embodiment, the polishing composition of the polishing system preferably comprises about 0.001 wt. % to about 0.5 wt. % benzotriazole and more preferably about 0.005 wt. % to about 0.1 wt. % benzotriazole.

In a second embodiment, the polishing system comprises at least a first and at least a second heterocyclic compound. In this second embodiment, preferably the first heterocyclic compound comprises benzotriazole or a derivative thereof and the at least one second heterocyclic compound comprises triazole or a derivative thereof, and more preferably comprises 1,2,4-triazole. Most preferably, the first heterocyclic compound comprises benzotriazole and the second heterocyclic compound comprises 1,2,4-triazole. The polishing composition of the polishing system of the second embodiment typically comprises about 0.005 wt. % or more (e.g., about 0.01 wt. % or more, or about 0.025 wt. % or more, or about 0.05 wt. % or more) of each of the first and the at least second heterocyclic compound. Preferably, the polishing composition of the polishing system of the second embodiment comprises about 1 wt. % or less (e.g., about 0.5 wt. % or less, or about 0.25 wt. % or less, or even about 0.1 wt. % or less) of each of the first and the at least second heterocyclic compound. In other words, the polishing composition of the second embodiment comprises about 0.01 wt.

% to about 2 wt. % (e.g., about 0.02 wt. % to about 1 wt. %, or about 0.05 wt. % to about 0.5 wt. %) of a mixture of the first and the at least second heterocyclic compound.

The polishing composition optionally comprises a phosphonic acid. The function of the phosphonic acid is, at least in part, to increase the polishing rate of an at least one optional tantalum or tantalum nitride layer. Useful phosphonic acids in the context of the invention include but are not limited to 1-hydroxyethylidene-1,1-diphosphonic acid, aminotris(methylenephosphonic acid), N-carboxymethylaminomethanephosphonic acid, 1-hydroxyethane-1,1,-diphosphonic acid, dialkyl phosphonates, dialkyl alkylphosphonates, and mixtures thereof. If present, the phosphonic acid can be present in the polishing composition of the invention at any suitable concentration but typically the polishing composition of the polishing system will comprise about 0.01 wt. % to about 5 wt. % (e.g., about 0.1 wt. % to about 2.5 wt. %, or about 0.2 wt. % to about 1 wt. %) of the phosphonic acid.

The polishing composition optionally comprises a diamine compound comprising an ether group. The function of the diamine compound comprising an ether group is, at least in part, to suppress the polishing rate of an at least one optional tantalum or tantalum nitride layer. Any suitable diamine compound comprising an ether group can be used in conjunction with the invention. A diamine compound, as used herein, is any compound comprising two nitrogen atoms which provide two amine groups. The nitrogen atoms can have any suitable spatial arrangement within the diamine compound. For example, the nitrogen atoms can be bonded directly to each other, or an intervening group of atoms can separate the nitrogen atoms. Further, the nitrogen atoms, independently or together, can be part of an acyclic chain, or form part of a ring structure.

Each nitrogen atom forming the amine group, independently, can be unsubstituted (e.g., $—NH_2$ or $—NH_3^+$) or substituted (e.g., with one or more carbon-containing or hetero-atom containing groups). Depending on the number of atoms to which each nitrogen atom is bonded, the nitrogen atoms can be charged or uncharged. Of course, when a nitrogen atom assumes a quaternary configuration (e.g., is bound to four atoms), the nitrogen atom bears a positive charge. Thus, the diamine compound can exist as a free base (e.g., wherein both nitrogen atoms are unprotonated), a mono addition salt of an acid (e.g., wherein only one nitrogen atom is protonated), or a bis addition salt of an acid (e.g., wherein both nitrogen atoms are protonated). Accordingly, the diamine compound may further comprise one or more counter-ions as appropriate.

The diamine compound comprises at least one ether group, and can comprise more than one ether group (e.g., a polyether diamine). Also, the diamine compound comprising at least one ether group (e.g., two or more ether groups) can be derived from the combination of two, three, or more monomeric units, such as ethylene oxide or propylene oxide, to provide a linear diamine polyether. Preferably, the diamine compound comprising an ether group is a polyether diamine. More preferably, the diamine compound comprising an ether group is a trioxa-tridecane diamine. A trioxa-tridecane diamine is a compound comprising a 13-atom linear chain having three oxygen atoms and two nitrogen atoms incorporated into the linear chain. The trioxa-tridecane diamine can be further substituted at any available position with one or more suitable substituent groups. An example of a trioxa-tridecane diamine suitable for use in conjunction with the invention is 4,7,10-trioxa-1,13-tridecane diamine.

The polishing composition can comprise any suitable amount of the diamine compound comprising an ether group. If present, preferably the polishing composition will comprise about 0.01 wt. % to about 1 wt. % (e.g., about 0.05 wt. % to about 0.5 wt. %) of the diamine compound comprising an ether group.

The polishing composition can comprise a dispersing agent. Examples of suitable dispersing agents include phosphoric acid, organic acids, tin oxides, and phosphonate compounds. Preferably, the dispersing agent is a polyacrylic acid or a polymethacrylic acid, and more preferably a polyacrylic acid. When present, the polishing composition of the polishing system comprises about 0.001 wt. % to about 0.5 wt. % (e.g., about 0.01 to about 0.1 wt. %) of the dispersing agent.

The polishing composition can have any suitable pH. Preferably, the polishing composition has a pH of about 6 to about 12, more preferably about 7 to about 9. The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be any suitable acid or base strong enough to produce the desired final pH. Examples of suitable acids include nitric acid, acetic acid, phosphoric acid, and the like. Examples of suitable bases include potassium hydroxide, ammonium hydroxide, and tetraalkylammonium hydroxide. The pH buffering agent can be any suitable buffering agent, for example, phosphates, acetates, borates, ammonium salts, and the like. The polishing composition can comprise any suitable amount of a pH adjustor and/or a pH buffering agent, provided such amount is sufficient to achieve and/or maintain the pH of the polishing composition within the ranges set forth herein.

The polishing composition optionally further comprises one or more other additives. Such additives include any suitable surfactant and/or rheological control agent. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally further comprises an antifoaming agent. The anti-foaming agent can be any suitable anti-foaming agent. Suitable antifoaming agents include, but are not limited to, silicon-based and acetylenic diol-based antifoaming agents. The amount of anti-foaming agent present in the polishing composition typically is about 40 ppm to about 140 ppm.

The polishing composition optionally further comprises a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, hydrogen peroxide, organic acid, etc.) as well as any combination of ingredients (e.g., abrasive, hydrogen peroxide, organic acid, at least one heterocyclic compound, etc.).

Any of the components used in conjunction with the invention can be provided in the form of a mixture or solution in water. Two or more components then desirably are individually stored and subsequently mixed to form the polishing composition of the polishing system. In this regard, it is suitable for the polishing composition to be prepared (e.g., for all the components to be mixed together) and then delivered to the surface of the substrate. It is also suitable for the polishing composition to be prepared on the surface of the substrate, through delivery of the components of the polishing composition from two or more distinct sources, whereby the components of the polishing composition meet at the surface of the substrate (e.g., at the point-of-use). In either case, the flow rate at which the components of the polishing composition are delivered to the surface of the substrate (i.e., the delivered amount of the particular components of the polishing composition) can be altered prior to the polishing process and/or during the polishing process, such that the polishing characteristics, such as the polishing rate, of the polishing system is altered.

The polishing composition can be supplied as a one package system comprising hydrogen peroxide, an organic acid, at least one heterocyclic compound, and water. Alternatively, the organic acid, at least one heterocyclic compound, and water can be supplied in a first container, and the hydrogen peroxide can be supplied in a second container, as a solution in water or in a solid form (e.g., sodium percarbonate). Optional components, such as an abrasive, phosphonic acid, and a diamine compound comprising an ether group, can be placed in the first and/or second containers or a third container, although typically not in the same container with the hydrogen peroxide and any other oxidizing agent. Furthermore, the components in a first container can be in dry form while the components in a second container can be in the form of an aqueous dispersion or solution. Moreover, the components in the first or second containers can have different pH values, or alternatively substantially similar, or even equal, pH values. If an optional component such as an abrasive is a solid, it may be supplied either in dry form or as a mixture in water. The hydrogen peroxide desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, 1 minute or less prior to use), or directly at the point-of-use. Other two-container, or three or more container, combinations of the components of the polishing composition are within the knowledge of one of ordinary skill in the art.

The polishing composition of the polishing system also can be provided as a concentrate which is intended to be diluted with an appropriate amount of water prior to use. Preferably, the hydrogen peroxide is provided separately and not as a component of the concentrate. In such an embodiment, the polishing composition concentrate can comprise an optional abrasive, organic acid, at least one heterocyclic compound, and water in amounts such that, upon dilution of the concentrate with an appropriate amount of water, each component of the polishing composition will be present in the polishing composition in an amount within the appropriate range recited above for each component. For example, the optional abrasive, organic acid, and at least one heterocyclic compound, can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the organic acid, at least one heterocyclic compound, and other suitable additives are at least partially or fully dissolved in the concentrate.

Desirably, the difference between the open circuit potential of copper and the open circuit potential of ruthenium in the polishing composition is about 50 mV or less (e.g., about 40 mV or less). As is well known, two dissimilar metals which are in electrical contact, when immersed in or contacted with an electrolyte, form a galvanic cell. In a galvanic cell, a first metal, the anode, will corrode (e.g., oxidize) at a faster rate than it would in the absence of the second metal. Correspondingly, the second metal, the cathode, will corrode at a slower rate than it would in the absence of the first metal. The driving force for the corrosion process is the potential difference between the two metals, which is the difference in the open circuit potential of the two metals in the particular electrolyte. The open circuit potential of a metal in an electrolyte is a function of the nature of the electrolyte, which depends at least in part on the concentration of the components of the electrolyte, the pH, and the temperature of the system comprising the metal and the electrolyte. Thus, the potential difference of the two metals comprising the galvanic cell when the metals are in contact with an electrolyte will lead to production of a galvanic current. The magnitude of the galvanic current is directly related to the rate of corrosion suffered by the anodic component of the galvanic cell, which in this case is copper. Advantageously, when the open circuit potential difference of copper and ruthenium is less than about 50 mV, the rate of corrosion of copper resulting from galvanic coupling with ruthenium is sufficiently reduced to allow for effective control over the copper polishing rate and to reduce copper etching by the polishing composition.

The open circuit potential of copper and of ruthenium in the polishing composition can be measured using any suitable method. A particularly useful method for determining electrochemical characteristics of metals is potentiodynamic polarization.

In accordance with the invention, the substrate can be polished with the polishing system described herein by any suitable technique. The method of the invention is particularly well-suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing system of the invention, and by the polishing component, generally the polishing pad moving relative to the substrate, with the other components of the polishing system therebetween, so as to abrade and remove a portion of the substrate and thereby polish at least a portion of the substrate.

Advantageously, the inventive method allows for control of the selectivity for the polishing of a substrate comprising at least one ruthenium layer, at least one copper layer, and optional at least one tantalum layer. Selectivity is defined herein as the ratio of the polishing rate of one layer compared to the polishing rate of a second, different layer. In a substrate comprising a layer of ruthenium and a layer of copper, the ruthenium layer and the copper layer will be polished at different rates. Typically, the copper layer will overcoat the ruthenium layer so that the polishing process will first remove the bulk of the overlying copper layer and then will begin removing the underlying ruthenium layer with copper still available to the polishing system. When both copper and ruthenium are available to the polishing system, if the rate of copper polishing is significantly greater than the rate of ruthenium polishing, the copper layer can be overpolished, which leads to dishing and/or erosion of the copper layer.

Similarly, in a substrate comprising at least one layer of ruthenium, at least one layer of copper, and at least one layer of tantalum or tantalum nitride, the layers of ruthenium, copper, and tantalum or tantalum nitride will be polished at different rates. Typically, the layer of ruthenium is between the copper and tantalum or tantalum nitride layer, and thus the tantalum or tantalum nitride layer will be the last layer to be exposed to the polishing system. In one embodiment, the polishing rate for tantalum or tantalum nitride is similar to the polishing rates for copper and for ruthenium so that tantalum or tantalum nitride can be removed without subjecting the copper layer and/or the ruthenium layer to overpolishing. In another embodiment, the polishing rate for tantalum or tantalum nitride is considerably less than the polishing rates for copper and for ruthenium so that the tantalum or tantalum nitride layer can act as a stopping layer. After polishing of the copper and ruthenium layers, the polishing system can be altered to provide for a suitable removal rate of tantalum or tantalum nitride.

Without wishing to be bound by any particular theory, in embodiments wherein the polishing system comprises at least one heterocyclic compound comprising benzotriazole and comprises substantially no triazole, the benzotriazole is believed to contribute to formation of a highly passivated film on copper, thereby reducing the copper polishing rate. In these embodiments, the selectivity for polishing of copper compared to the at least one ruthenium layer is reduced and preferably is about 4 or less (e.g., about 3 or less, or about 2 or less). In other embodiments, wherein the polishing system comprises at least two heterocyclic compounds comprising benzotriazole and triazole, preferably 1,2,4-triazole, the competition for surface sites on copper between the at least two heterocyclic compounds results in a less passivated film on copper. In these other embodiments, the polishing system exhibits an increased copper polishing rate such that the selectivity for polishing of copper over ruthenium is increased relative to triazole-free embodiments. Thus, the selectivity for polishing of copper compared with polishing of ruthenium can be controlled in the inventive polishing system by the choice of the type and concentrations of heterocyclic compounds present in the polishing composition of the polishing system.

As noted above, the polishing composition optionally comprises a phosphonic acid and/or a diamine compound comprising an ether group. When the polishing composition comprises a phosphonic acid and substantially no diamine compound comprising an ether group, the polishing system exhibits an increased removal rate for tantalum, as compared with a similar polishing system comprising neither compound. When the polishing composition comprises a diamine compound comprising an ether group and substantially no phosphonic acid, the polishing system exhibits a reduced removal rate for tantalum, as compared with a similar polishing system comprising neither compound. Thus, inclusion of a phosphonic acid or a diamine compound comprising an ether group into the polishing composition allows for tailoring of the tantalum selectivity, relative to copper and ruthenium, exhibited by the polishing system.

The following examples further illustrate the invention but, of course, should not be construed as in any way limiting its scope.

The polishing experiments reflected in the examples generally involved use of a commercially available polishing apparatus with 13.8 kPa (2 psi) downforce pressure of the substrate against the polishing pad, 90 rpm platen speed, and 93 rpm carrier speed.

EXAMPLE 1

This example demonstrates the removal rates for polishing of separate substrates comprising copper, ruthenium, tantalum, and a silicon oxide dielectric material generated from tetraethylorthosilicate achievable by the method of the invention. The silicon oxide dielectric material is referred to as "TEOS" herein.

Five similar sets of four substrates, each of which substrates separately comprised copper, ruthenium, tantalum, and TEOS, were polished with five different polishing compositions (Polishing Compositions A, B, C, D, and E). Each of the compositions comprised 0.7 wt. % of α-alumina treated with a negatively-charged polymer, 0.8 wt. % of tartaric acid, 3 wt. % of hydrogen peroxide, and 0.05 wt. % of Alcosperse 630 polyacrylic acid dispersant, at a pH of 8.4 in water. Polishing Composition A additionally contained 0.0278 wt. % of benzotriazole (BTA), 0.048 wt. % of 1,2,4-triazole (TAZ), and 0.08 wt. % of 4,7,10-trioxa-1,13-tridecane diamine (TTD). Polishing Composition B additionally contained 0.0278 wt. % of benzotriazole, and 0.048 wt. %-of 1,2,4-triazole. Polishing Composition C additionally contained 0.5 wt. % of aminotris(methylenephosphonic acid) (ATMPA), 0.0303 wt. % of benzotriazole, and 0.048 wt. % of 1,2,4-triazole. Polishing Composition D additionally contained 0.6 wt. % of aminotris(methylenephosphonic acid), 0.0303 wt. % of benzotriazole, and 0.048 wt. % of 1,2,4-triazole. Polishing Composition E additionally contained 0.6 wt. % of aminotris(methylenephosphonic acid) and 0.0303 wt. % of benzotriazole. The polishing pad employed was a closed-cell thermoset polyurethane pad.

Following polishing, the removal rates (RR) for copper, ruthenium, tantalum, and TEOS were determined for each of the polishing compositions, and the results are summarized in Table 1.

TABLE 1

| Polishing Composition | BTA (wt. %) | TAZ (wt. %) | TTD (wt. %) | ATMPA (wt. %) | Cu RR (Å/min) | Ru RR (Å/min) | Ta RR (Å/min) | TEOS RR (Å/min) |
|---|---|---|---|---|---|---|---|---|
| A | 0.0278 | 0.048 | 0.08 | 0 | 601 | 203 | 39 | 17 |
| B | 0.0278 | 0.048 | 0 | 0 | 697 | 241 | 105 | 55 |
| C | 0.0303 | 0.048 | 0 | 0.5 | 674 | 286 | 171 | 27 |
| D | 0.0303 | 0.048 | 0 | 0.6 | 722 | 279 | 203 | 43 |
| E | 0.0303 | 0 | 0 | 0.6 | 316 | 224 | 136 | 38 |

As is apparent from the results set forth in Table 1, Polishing Compositions A-E exhibited polishing selectivities for copper over ruthenium of about 1.4:1 to about 3.0:1, with useful removal rates observed for ruthenium. Polishing Compositions A, B, C, and D, which contain both benzotriazole and 1,2,4-triazole exhibited polishing selectivities for copper over ruthenium of approximately 2.6:1 to 3:1, whereas Polishing Composition E, which comprised benzotriazole but no 1,2,4-triazole, exhibited a polishing selectivity for copper over ruthenium of about 1.4:1. Polishing Composition A, which comprised 0.08 wt. % of 4,7,10-trioxa-1,13-tridecane diamine (TTD), exhibited polishing rates for copper and for ruthenium versus tantalum that were approximately 15.4:1 and 5.2:1, respectively. The tantalum polishing rate exhibited by Polishing Composition A was approximately 0.37 times the tantalum polishing rate exhibited by Polishing Composition B, which did not comprise TTD. Polishing Compositions C, D, and E, which contained aminotris(methylenephosphonic acid), exhibited approximately 1.3 to about 1.6 times greater removal rate for tantalum as compared with Polishing Composition B, which comprised no aminotris(methylenephosphonic acid). Finally, Polishing Composition A and Polishing Compositions C-E, which comprised either TTD or aminotris(methylenephosphonic acid), respectively, exhibited TEOS removal rates that were about 31% to about 78% the TEOS removal rate observed for Polishing Composition B, which comprised neither TTD nor aminotris(methylenephosphonic acid).

Thus, the results of this example demonstrate the capability of the inventive polishing system to (a) polish substrates comprising copper and substrates comprising ruthenium at substantially similar rates and with controllable selectivities, and (b) polish substrates additionally comprising tantalum at variable tantalum polishing rates.

EXAMPLE 2

Four separate substrates comprising copper, ruthenium, tantalum, and TEOS, were polished with a polishing composition comprising 0.7 wt. % of α-alumina treated with a negatively-charged polymer, 0.8 wt. % of tartaric acid, 3 wt. % of hydrogen peroxide, 0.05 wt. % of Alcosperse 630 polyacrylic acid dispersant, 0.6 wt. % of aminotris(methylenephosphonic acid), and 0.0303 wt. % of benzotriazole at a pH of 8.4 in water. The polishing pad employed was a thermoplastic polyurethane pad comprising a mixture of closed and open cells.

Following polishing, the removal rates for copper, ruthenium, tantalum, and TEOS were determined, and the results set forth in Table 2.

TABLE 2

| Cu RR (Å/min) | Ru RR (Å/min) | Ta RR (Å/min) | TEOS RR (Å/min) |
|---|---|---|---|
| 355 | 289 | 173 | 43 |

As is apparent from the results set forth in Table 2, the polishing selectivity exhibited by the inventive polishing system was about 1.23:1 for copper over ruthenium, about 2.05:1 for copper over tantalum, and about 1.67:1 for ruthenium over tantalum.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate, which method comprises:
   (i) contacting a substrate comprising at least one layer of ruthenium and at least one layer of copper with a polishing pad and a chemical-mechanical polishing composition comprising:
      (a) an abrasive consisting of α-alumina treated with a negatively-charged polymer or copolymer,
      (b) hydrogen peroxide,
      (c) an organic acid,
      (d) at least one heterocyclic compound, wherein the at least one heterocyclic compound comprises at least one nitrogen atom,
      (e) a phosphonic acid, and
      (f) water,
   (ii) moving the polishing pad relative to the substrate, and
   (iii) abrading at least a portion of the substrate to polish the substrate,
wherein the pH of the water and any components dissolved or suspended therein is about 6 to about 12, wherein the at least one layer of ruthenium and at least one layer of copper are in electrical contact and are in contact with the polishing composition, wherein the difference between the open circuit potential of copper and the open circuit potential of ruthenium in the water and any components dissolved or suspended therein is about 50 mV or less, and wherein a selectivity for polishing copper as compared to ruthenium is about 2 or less.

2. The method of claim 1, wherein the polishing composition comprises about 0.01 wt. % to about 5 wt. % of abrasive.

3. The method of claim 1, wherein the negatively-charged polymer or copolymer is selected from the group consisting of poly(2-acrylamido-2-methyipropane sulfonic acid) and polystyrenesulfonic acid.

4. The method of claim 1, wherein the polishing composition comprises about 0.1 wt. % to about 5 wt. % of hydrogen peroxide.

5. The method of claim 1, wherein the organic acid is selected from the group consisting of malonic acid, succinic acid, adipic acid, lactic acid, malic acid, citric acid, glycine, aspartic acid, tartaric acid, gluconic acid, iminodiacetic acid, and fumaric acid.

6. The method of claim 5, wherein the organic acid is tartaric acid.

7. The method of claim 1, wherein the polishing composition comprises at least one heterocyclic compound selected from the group consisting of 1,2,3-triazole, 1,2,4-triazole, benzotriazole, benzimidazole, benzothiazole, and combinations thereof.

8. The method of claim 7, wherein the polishing composition comprises benzotriazole.

9. The method of claim 8, wherein the polishing composition comprises about 0.005 wt. % to about 0.1 wt. % of benzotriazole.

10. The method of claim 8, wherein the polishing composition further comprises 1,2,4-triazole.

11. The method of claim 1, wherein the polishing composition further comprises a dispersing agent.

12. The method of claim 11, wherein the dispersing agent is polyacrylic acid.

13. The method of claim 1, wherein the phosphonic acid is selected from the group consisting of 1-hydroxyethylidene-1,1-diphosphonic acid, aminotris(methylenephosphonic acid), N-carboxymethylaminomethanephosphonic acid, 1-hydroxyethane-1,1-diphosphonic acid, dialkyl phosphonates, dialkyl alkylphosphonates, and mixtures thereof.

14. The method of claim 1, wherein the polishing composition further comprises a diamine compound comprising an ether group.

15. The method of claim 14, wherein the diamine compound comprising an ether group is a polyether diamine.

16. The method of claim 1, wherein the substrate further comprises at least one layer of tantalum.

17. The method of claim 16, wherein the substrate comprises at least one layer of ruthenium disposed between the at least one tantalum layer and the at least one copper layer.

18. The method of claim 16, wherein the substrate further comprises a material that is not copper or ruthenium, and selectivity for polishing either copper or ruthenium as compared to the material that does not comprise copper or ruthenium is about 2 or less.

19. The method of claim 1, wherein the pH is about 7 to about 9.

* * * * *